United States Patent
Lee et al.

(10) Patent No.: US 10,749,066 B2
(45) Date of Patent: *Aug. 18, 2020

(54) PROXIMITY SENSOR HAVING SUBSTRATE INCLUDING LIGHT SENSING AREA AND TEMPERATURE SENSING AREA

(71) Applicant: HAESUNG DS CO., LTD., Changwon-si (KR)

(72) Inventors: Jin Woo Lee, Seoul (KR); Jin Kee Hong, Seoul (KR); Byung Moon Lee, Seoul (KR); Jong Woo Kim, Seoul (KR)

(73) Assignee: HAESUNG DS CO., LTD., Changwon-Si (KR)

(*) Notice: Subject to any disclaimer, the term of this patent is extended or adjusted under 35 U.S.C. 154(b) by 64 days.

This patent is subject to a terminal disclaimer.

(21) Appl. No.: 16/183,429

(22) Filed: Nov. 7, 2018

(65) Prior Publication Data
US 2020/0028021 A1    Jan. 23, 2020

(30) Foreign Application Priority Data

Apr. 5, 2018 (KR) .......................... 10-2018-0040005

(51) Int. Cl.
*H01L 31/167* (2006.01)
*H01L 31/18* (2006.01)
(Continued)

(52) U.S. Cl.
CPC .......... *H01L 31/167* (2013.01); *H01L 31/024* (2013.01); *H01L 31/022408* (2013.01); *H01L 31/1828* (2013.01)

(58) Field of Classification Search
CPC ........... H01L 31/167; H01L 31/022408; H01L 31/024; H01L 31/1828; G01N 2021/8877
See application file for complete search history.

(56) References Cited

U.S. PATENT DOCUMENTS 8,658,975 B2    2/2014  Lee et al.
9,070,648 B2    6/2015  de Jong et al.
(Continued)

FOREIGN PATENT DOCUMENTS

CN    105352601 A    2/2016
KR    20150135958 A    12/2015
(Continued)

*Primary Examiner* — Matthew E. Gordon
(74) *Attorney, Agent, or Firm* — Schwabe, Williamson & Wyatt, P.C.

(57) ABSTRACT

A proximity sensor includes a circuit board; a light-emitting element and a light-receiving element on the circuit board; a light barrier; molding portions; and a transparent board disposed on the molding portions and configured to form an air gap with the light-receiving element. The light-receiving element includes: a substrate having a light sensing area and a temperature sensing area; a first input electrode and a first output electrode which are aligned in the light sensing area and apart from each other with a first delay gap therebetween; a sensing film covering at least some portions of the first input electrode and the first output electrode; and a second input electrode and a second output electrode which are aligned in the temperature sensing area and apart from each other with a second delay gap therebetween. The second delay gap is exposed to air.

7 Claims, 11 Drawing Sheets

(51) Int. Cl.
*H01L 31/0224* (2006.01)
*H01L 31/024* (2014.01)

(56) References Cited

U.S. PATENT DOCUMENTS

| | | |
|---|---|---|
| 2014/0061444 A1 | 3/2014 | Wang et al. |
| 2014/0070078 A1 | 3/2014 | Land et al. |
| 2014/0097451 A1 | 4/2014 | Lin |
| 2014/0131551 A1* | 5/2014 | Lin ..................... G01S 7/497 |
| | | 250/206.1 |
| 2016/0363465 A1 | 12/2016 | Teng et al. |
| 2019/0310183 A1* | 10/2019 | Lee ................. G01N 21/1702 |

FOREIGN PATENT DOCUMENTS

| | | |
|---|---|---|
| KR | 1020170080108 A | 7/2017 |
| TW | 201411816 A | 3/2014 |
| TW | 201415652 A | 4/2014 |
| TW | 201418745 A | 5/2014 |
| TW | 201421719 A | 6/2014 |
| TW | 201643467 A | 12/2016 |
| WO | 2008152879 A1 | 12/2008 |

\* cited by examiner

PROXIMITY SENSOR HAVING SUBSTRATE INCLUDING LIGHT SENSING AREA AND TEMPERATURE SENSING AREA

CROSS-REFERENCE TO RELATED APPLICATION

This application claims the benefit of Korean Patent Application No. 10-2018-0040005, filed on Apr. 5, 2018, in the Korean Intellectual Property Office, the disclosure of which is incorporated herein in its entirety by reference.

BACKGROUND

1. Field

One or more embodiments relate to a proximity sensor, and more particularly, to a proximity sensor including a light-receiving element using surface acoustic waves.

2. Description of the Related Art

In general, a proximity sensor identifies an object coming close thereto and mainly functions as an input device receiving user inputs. Without physical contact with a body portion of a user, the proximity sensor may detect a size and a location of a proximate object, a distance therewith, and the like.

For example, the proximity sensor is located close to a display of a mobile terminal, and a nearby object is recognized by the proximity sensor. Thus, the mobile terminal may process data corresponding to the nearby object and may output visual information corresponding to the processed data on the display.

Recently, proximity sensors have been usually manufactured using photodiodes. However, optical sensors using photodiodes include amplifying circuits and thus are vulnerable to noise.

Surface acoustic wave technology using a principle, in which mechanical energy is converted into electrical energy or electrical energy into mechanical energy, may be relatively robust to noise. Accordingly, technology using surface acoustic waves by using biosensors has been introduced, and existing surface acoustic wave sensors are too big to be used as sensors in mobile or wearable devices.

SUMMARY

One or more embodiments include a proximity sensor, and more particularly, to a proximity sensor including a light-receiving element using surface acoustic waves.

Additional aspects will be set forth in part in the description which follows and, in part, will be apparent from the description, or may be learned by practice of the presented embodiments.

According to one or more embodiments, a proximity sensor includes: a circuit board having a first bonding pad area and a second bonding pad area; a light-emitting element and a light-receiving element which are apart from each other and mounted on the circuit board; a light barrier disposed between the light-emitting element and the light-receiving element; molding portions surrounding the light-emitting element and the light-receiving element; and a transparent board disposed on the molding portions and configured to form an air gap with the light-receiving element, wherein the light-receiving element includes: a substrate having a light sensing area and a temperature sensing area and including a piezo electric material; a first input electrode and a first output electrode which are aligned in the light sensing area and apart from each other with a first delay gap between the first input electrode and the first output electrode; a sensing film overlapping the first delay gap and covering at least some portions of the first input electrode and the first output electrode; and a second input electrode and a second output electrode which are aligned in the temperature sensing area and apart from each other with a second delay gap between the second input electrode and the second output electrode, wherein the second delay gap is exposed to air.

The first input electrode may be configured to receive a first electrical signal and provide a first input acoustic wave to a first light sensing area, the first output electrode may be configured to output a first output acoustic wave modulated by a first sensing film of which properties change according to external light, the second input electrode may be configured to receive a second electrical signal and provide a second input acoustic wave to the temperature sensing area, and the second output electrode may be configured to output a second output acoustic wave modulated by a substrate of which properties change according to a temperature.

On the circuit board, an integrated circuit (IC) chip connected to the light-receiving element may be further mounted, and the IC chip may be molded by the molding portions.

The light-emitting element may include a light emitting diode (LED) with wavelengths ranging from about 650 nm to about 780 nm, and the sensing film may include CdS or CdSe.

The first input electrode and the second output electrode may include Inter Digital Transducer (IDT) electrodes including a plurality of fingers having comb shapes, and the sensing film may cover the plurality of fingers.

The proximity sensor may further include a ground electrode disposed between the light sensing area and the temperature sensing area, and the first input electrode and the second input electrode may be symmetrically aligned with respect to the ground electrode.

On the transparent board, patterns through which light having a certain frequency band penetrates may be formed.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

As the disclosure allows for various changes and numerous embodiments, particular embodiments will be illustrated in the drawings and described in detail in the written description. The attached drawings for illustrating embodiments of the present disclosure are referred to in order to gain a sufficient understanding of the present disclosure, the merits thereof, and the objectives accomplished by the implementation of the present disclosure. The disclosure may, however, be embodied in many different forms and should not be construed as being limited to the embodiments set forth herein. As used herein, the term "and/or" includes any and all combinations of one or more of the associated listed items. Expressions such as "at least one of", when preceding a list of elements, modify the entire list of elements and do not modify the individual elements of the list.

Hereinafter, the present disclosure will be described in detail by explaining embodiments of the disclosure with reference to the attached drawings. Like reference numerals in the drawings denote like elements, and thus their description will be omitted.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

It will be understood that when a layer, region, or component is referred to as being "connected to" another layer, region, or component, it can be directly on the other layer, region, or component or intervening layers, regions, or components may be present therebetween. In the present specification, for example, when a layer, region, or component is referred to as being electrically connected to another layer, region, or component directly or indirectly.

Figure 1:
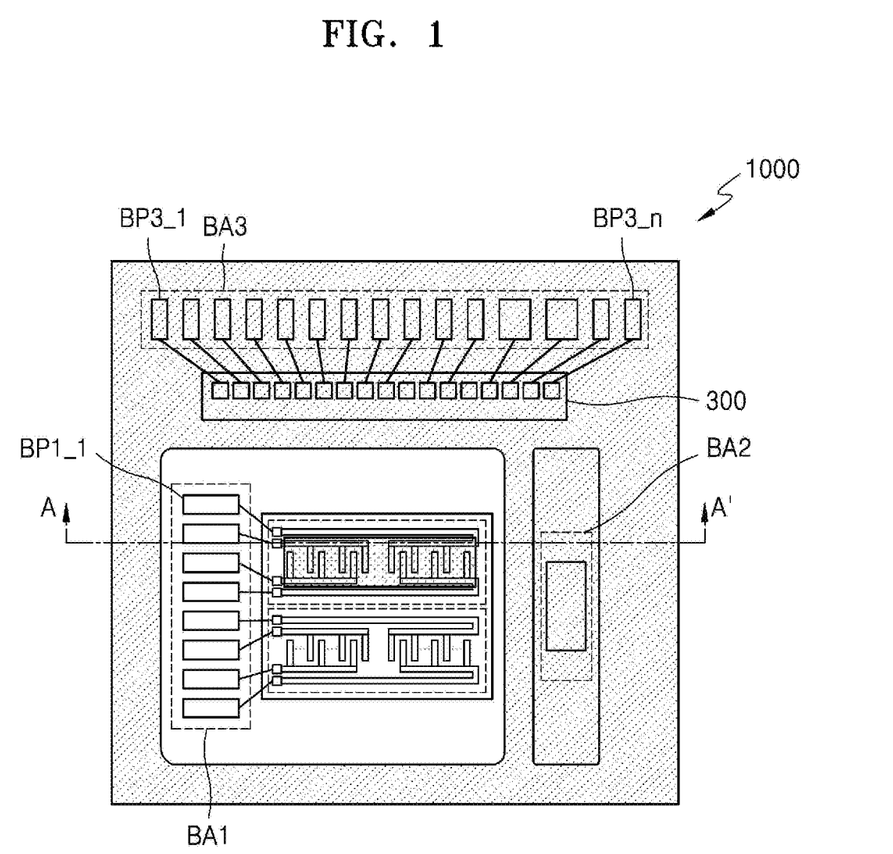
FIG. 1 is a schematic plan view of a proximity sensor according to an embodiment.
Figure 2:
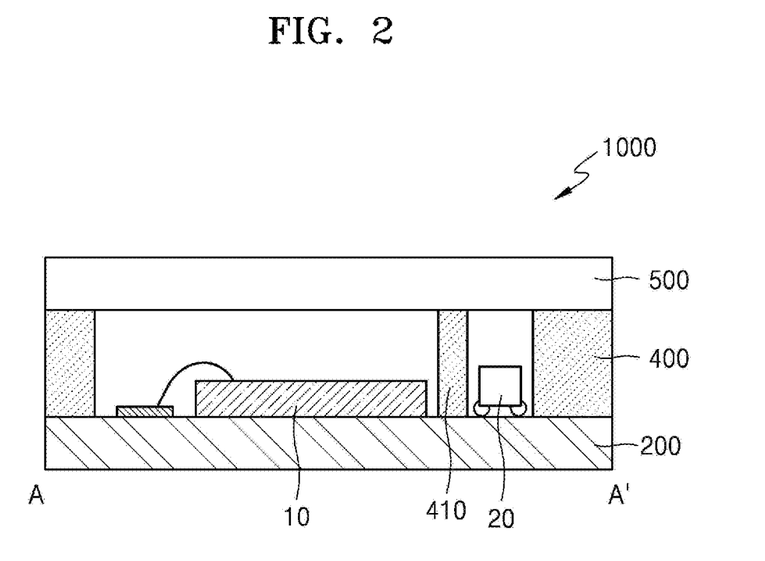
FIG. 2 is a schematic cross-sectional view of the proximity sensor of FIG. 1.

FIG. 1 is a schematic plan view of a proximity sensor 1000 according to an embodiment. FIG. 2 is a schematic cross-sectional view of the proximity sensor 1000 of FIG. 1.

Referring to FIGS. 1 and 2, the proximity sensor 1000 includes a circuit board 200, a light-receiving element 10 and a light-emitting element 20 mounted on the circuit board 200, a light barrier 410, molding portions 400, and a transparent board 500.

As light emitted from the light-emitting element 20 is reflected from a reflector such as a human body part and detected by the light-receiving element 10, the proximity sensor 1000 according to an embodiment may identify the existence of the reflector that is close thereto.

In the present embodiment, the light-emitting element 20 may emit red light with the longest wavelengths among those of visible light. This is because the longer the wavelengths are, the easier the reflection becomes, and the light-receiving element 10 described below is included as an optical sensor detecting a visible light area. In some embodiments, the light-emitting element 20 may include a red light emitting diode (LED) having wavelengths ranging from about 650 nm to about 780 nm.

The light-receiving element 10 according to the present embodiment may include a sensor that measures a light amount and temperature using surface acoustic waves. The light-receiving element 10 will be described below. The light-emitting element 20 and the light-receiving element 10 are mounted on the circuit board 200.

The circuit board 200 may have a first bonding pad area BA1, a second bonding pad area BA2, and a third bonding pad area BA3. The first bonding pad area BA1 includes first bonding pads $BP1\_1$ to $BP1\_n$, and the first bonding pads $BP1\_1$ to $BP1\_n$ may be respectively connected to electrode pads of the light-receiving element 10 through wire bonding, etc.

The second bonding pad area BA2 includes second bonding pads $BP2\_1$ to $BP2\_n$, and the second bonding pads $BP2\_1$ to $BP2\_n$ may be respectively connected to electrode pads of the light-emitting element 20 through wire bonding, flip chip bonding, or the like.

The third bonding pad area BA3 includes third bonding pads $BP3\_1$ to $BP3\_n$, and the third bonding pads $BP3\_1$ to $BP3\_n$ may be respectively connected to terminals of an integrated circuit (IC) chip 300 through wire bonding, flip chip bonding, or the like.

The first bonding pads $BP1\_1$ to $BP1\_n$ may be aligned in a row on an outer side of the light-receiving element 10. The third bonding pads $BP3\_1$ to $BP3\_n$ may be aligned in a row on an outer side of the IC chip 300. The third bonding pad area BA3 may correspond to one side of the circuit board 200 at an edge thereof.

The circuit board 200 may include a layer or layers, and wires that connect the third bonding pads $BP3\_1$ to $BP3\_n$ to the first bonding pads $BP1\_1$ to $BP1\_n$ and/or the third bonding pads $BP3\_1$ to $BP3\_n$ to the second bonding pads $BP2\_1$ to $BP2\_n$ may be formed on or in the circuit board 200.

The IC chip 300 may include a read out integrated circuit (ROIC) and may exchange electrical signals with the light-receiving element 10 and the light-emitting element 20. The IC chip 300 may generate electrical signals, may transmit the generated electrical signals to the light-receiving element 10, and may calculate the light amount and temperature based on the electrical signals received by the light-receiving element 10.

The light barrier 410 that blocks light is disposed between the light-receiving element 10 and the light-emitting element 20. Accordingly, the light from the light-emitting element 20 is not reflected and prevented from being directly irradiated onto the light-receiving element 10. The light barrier 410 may include a material through which light does not penetrate.

The light-receiving element 10 and the light-emitting element 20 are disposed on a central portion of the circuit board 200, and the molding portions 400 may be disposed on edges of the circuit board 200 to surround the light-receiving element 10 and the light-emitting element 20. The molding portions 400 may mold the IC chip 300 and the third bonding pad area BA3 and may prevent external noise from affecting the IC chip 300. The light barrier 410 may be integrated with the molding portions 400. In an embodiment, the molding portions 400 may be formed of resin and may include black dyes, etc.

Above the light-receiving element 10 and the light-emitting element 20, the transparent board 500 forming an air gap with the light-receiving element 10 may be disposed. The transparent board 500 may be disposed on and supported by the molding portions 400. The transparent board 500 may include a glass material.

The transparent board 500 penetrates light from the light-emitting element 20 to the outside, allows the light-receiving element 10 to measure reflected light, and also protects the light-receiving element 10 and the light-emitting element 20 from foreign materials.

In an embodiment, on the transparent board 500, patterns through which light having a certain frequency band penetrates may be formed. For example, on the transparent board 500, a pattern for infrared (IR)-cutting may be formed. In this case, wavelengths other than the light from the light-emitting element 20 may be blocked, and thus, the accuracy of the proximity sensor 1000 may be improved.

Figure 3:
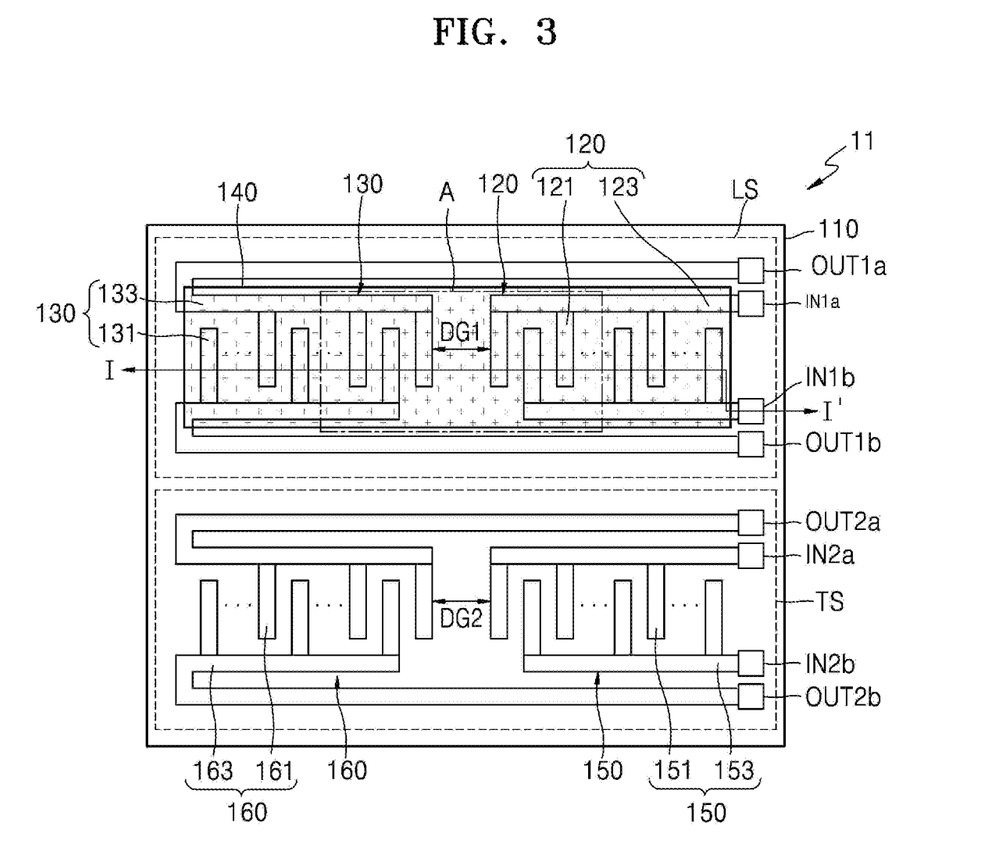
FIG. 3 is a plan view showing an example of a light-receiving element that may be included in the proximity sensor of the present disclosure.
Figure 4:
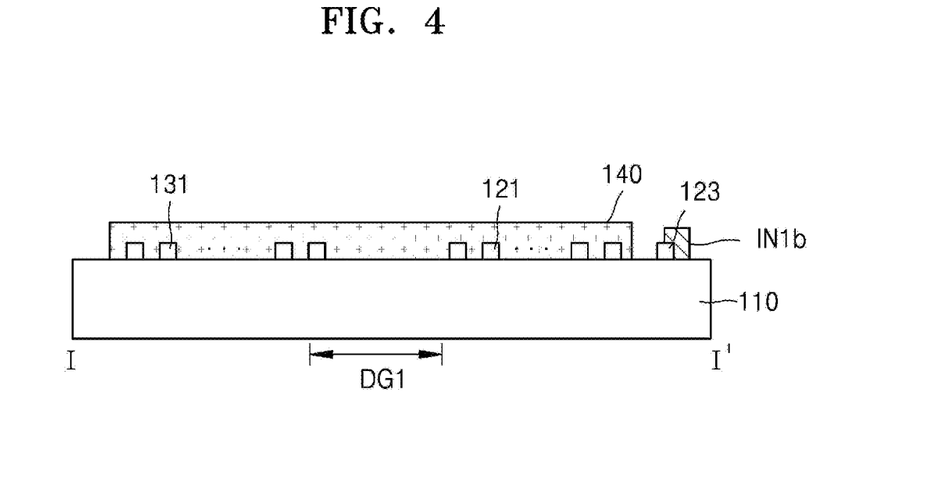
FIG. 4 is a cross-sectional view taken along a line I-I' of FIG. 3.
Figure 5:
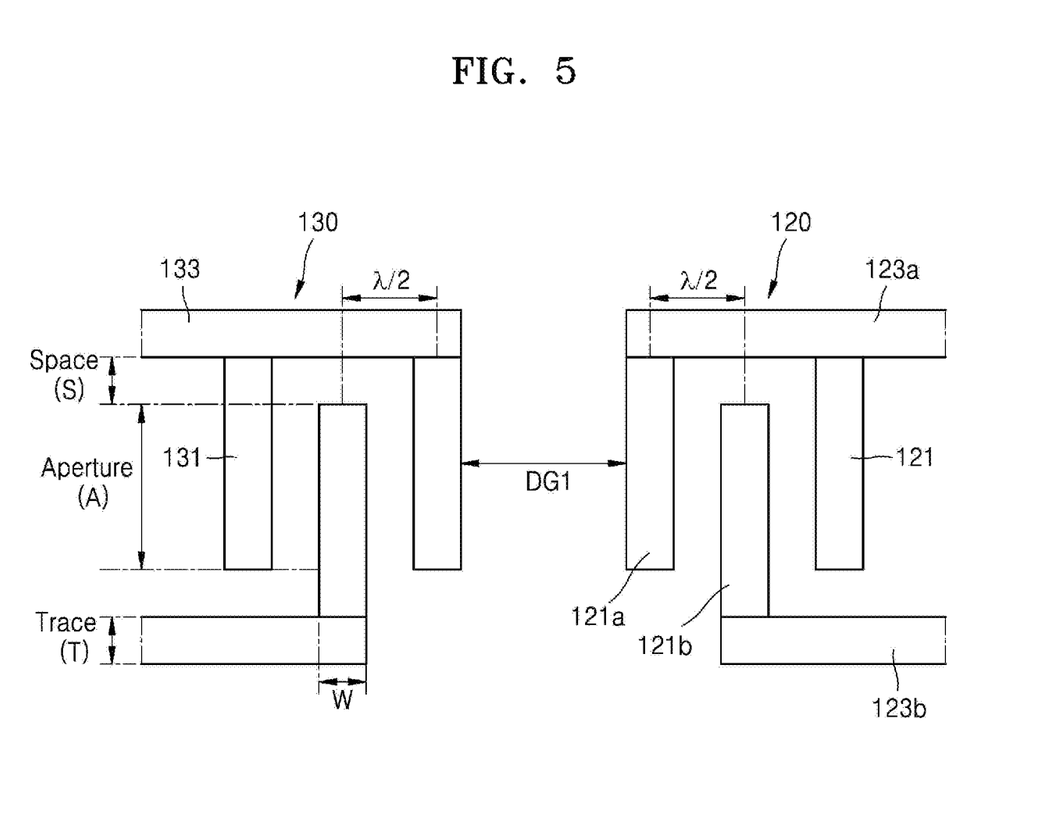
FIG. 5 is a plan view showing an area A of FIG. 1.

FIG. 3 is a plan view showing an example of a light-receiving element 11 that may be included in a proximity sensor of the present disclosure. FIG. 4 is a cross-sectional view taken along a line I-I' of FIG. 3. FIG. 5 is a plan view showing an area A of FIG. 1.

Referring to FIGS. 3 to 5, the light-receiving element 11 includes a light sensing area LS, which is prepared to sense light, and a temperature sensing area TS, which is prepared to measure a temperature, on one substrate 110 including a piezo-electric material. In the light sensing area LS, a first input electrode 120, a first output electrode 130, and a sensing film 140 are disposed, and in the temperature sensing area TS, a second input electrode 150 and a second output electrode 160 are disposed.

The first input electrode 120 and the first output electrode 130 are apart from each other with a first delay gap DG1 therebetween, and the sensing film 140 is disposed by covering at least some portions of the first input electrode 120 and the first output electrode 130. The second input electrode 150 and the second output electrode 160 are apart from each other with a second delay gap DG2 therebetween, and the second delay gap DG2 is exposed to air.

The light-receiving element 11 according to the present embodiment may be an element capable of measuring a light amount and a temperature based on a change in the surface acoustic waves. That is, the first input electrode 120 may provide first input acoustic waves to the light sensing area LS after receiving a first electrical signal, and the first output electrode 130 may output first output acoustic waves that are modulated by the sensing film 140 having properties changing according to external light.

The second input electrode 150 may provide second input acoustic waves to the temperature sensing area TS after receiving a second electrical signal, and the second output electrode 160 may output second output acoustic waves that are modulated by the substrate 110 having properties changing according to a temperature.

That is, the substrate 110 may include a piezo electric material capable of generating the surface acoustic waves in response to electrical signals and a material selected from among piezo electric materials, the material having properties changing according to the temperature. For example, the substrate 110 may include $LiNbO_3$(LN) or $LiTaO_3$ (LT). In some embodiments, the substrate 110 may include a piezo electric material of which a conversion rate $K^2$ of converting mechanical energy into electrical energy is at least 5% and a temperature coefficient (TDC) is 50 ppm/° C.

The sensing film 140 includes a material used to detect visible light, and the material may have properties changing in reaction to the visible light. That is, the sensing film 140 may receive light and may change propagation velocity of acoustic waves propagating through the substrate 110. In some embodiments, the sensing film 140 may include CdS or CdSe. The sensing film 140 may be formed by depositing CdS or CdSe, and a thickness of the sensing film 140 may be between about 50 nm and about 300 nm.

The first input electrode 120 may receive external electrical signals and form an electric field, and the substrate 110 may generate the surface acoustic waves that are mechanical vibrations by using the formed electric field. The generated surface acoustic waves are provided to the sensing film 140.

The first output electrode 130 may be apart from the first input electrode 120 with the first delay gap DG1 therebetween and may generate surface acoustic waves, which are changed by the sensing film 140, into electrical signals, thereby outputting the electrical signals. According to the detected light amount, a center frequency of the acoustic waves may move several tens to hundreds of KHz.

The first input electrode 120 and the first output electrode 130 may include Inter Digital Transducer (IDT) electrodes. The IDT electrodes may include a plurality of IDT fingers 121 and 131 having comb shapes and two bar electrodes 123 and 133 respectively connected to the IDT fingers 121 and 131.

The bar electrode 123 of the first input electrode 120 may be connected to first input pads IN1a and IN1b, and the bar electrode 133 of the first output electrode 130 may be connected to first output pads OUT1a and OUT1b. Any one of the first input pads IN1a and IN1b and any one of the first output pads OUT1a and OUT1b may be used as ground electrode pads.

The second input electrode 150 may form an electric field by receiving external electrical signals, and the substrate 110 may generate the surface acoustic waves that are the mechanical vibrations by using the formed electric field.

The second output electrode 160 may be apart from the second input electrode 150 with the second delay gap DG2 therebetween and may generate the acoustic waves, which are transmitted along a surface of the substrate 110, into electrical signals, thereby outputting the electrical signals. Since the properties of the substrate 110 may change according to the temperature, properties of the acoustic waves applied to the second output electrode 160 may differ according to the temperature.

The second input electrode 150 and the second output electrode 160 may be IDT electrodes. The IDT electrodes may include a plurality of IDT fingers 151 and 161 having comb shapes and two bar electrodes 153 and 163 respectively connected to the IDT fingers 151 and 161.

The bar electrode 153 of the second input electrode 150 may be connected to second input pads IN2a and IN2b, and the bar electrode 163 of the second output electrode 160 may be connected to second output pads OUT2a and OUT2b. Any one of the second input pads IN2a and IN2b and any one of the second output pads OUT2a and OUT2b may be used as ground electrode pads.

In some embodiments, the first input electrode 120, the first output electrode 130, the second input electrode 150, and the second output electrode 160 may include aluminum (Al), and thicknesses of the first input electrode 120, the first output electrode 130, the second input electrode 150, and the second output electrode 160 may be between about 100 nm and about 300 nm.

The first input pads IN1a and IN1b, the first output pads OUT1a and OUT1b, the second input pads IN2a and IN2b, and the second output pads OUT2a and OUT2b are aligned on one side of the substrate 110. Lengths of the bar electrode 123 of the first input electrode 120 and the bar electrode 133 of the first output electrode 130 may differ, and lengths of the bar electrode 153 of the second input electrode 150 and the bar electrode 163 of the second output electrode 160 may differ.

In some embodiments, the length of the bar electrode 123 of the first input electrode 120 may be less than that of the bar electrode 133 of the first output electrode 130, and the length of the bar electrode 153 of the second input electrode 150 may be less than that of the bar electrode 163 of the second output electrode 160.

Due to the alignment of the aforementioned electrode pads, that is, the first input and output pads IN1a, IN1b, IN2a, and IN2b and the second input and output pads OUT1a, OUT1b, OUT2a, and OUT2b, the entire size of the light-receiving element 11 may be reduced, and accordingly, the entire size of the proximity sensor 1000 may be reduced.

The light-receiving element 11 according to the present embodiment has the light sensing area LS and the temperature sensing area TS and thus may simultaneously measure the light amount and the temperature. The light amount and the temperature may be derived from a difference between center frequencies of the input acoustic waves and the output acoustic waves. In other words, the light amount may be derived from a difference $\Delta fc1$ between a center frequency $fc\_in1$ of first input acoustic waves and a center frequency $fc\_out1$ of first output acoustic waves, and the temperature may be derived from a difference $\Delta fc2$ between a center frequency $fc\_in2$ of second input acoustic waves and a center frequency $fc\_out2$ of second output acoustic waves. Relations or tables of the differences $\Delta fc1$ and $\Delta fc2$ and the light amount and/or the temperature are stored in a central processing unit (CPU) of a controller, etc. that is connected to the light-receiving element 11, and thus the light amount and the temperature may be derived by measuring the differences $\Delta fc1$ and $\Delta fc2$.

A temperature change of the substrate 110 is reflected to a value of the center frequency $fc\_out1$ of the first output acoustic waves used to measure the light amount, and the second output acoustic waves used to measure the temperature may be used as a reference value with respect to the first output acoustic waves. The center frequency $fc\_out2$ of second output acoustic waves may be a parameter for measuring the temperature and may also be used as a reference value used to measure the light amount from which temperature properties are excluded.

The light-receiving element 11 according to the present embodiment is designed to have a tiny size of less than about 2.5 mm×2.5 mm. Also, in order to minimize the IC chip 300, for example, an ROIC, which is connected to the light-receiving element 11 and detects a frequency change of the acoustic waves, Q values of the acoustic waves obtained from the light-receiving element 11 are set to be greatly high.

To satisfy the conditions, the sensing film 140 that detects the light amount may be disposed to cover the IDT fingers 121 of the first input electrode 120 and the IDT fingers 131 of the first output electrode 130. The purpose of such alignment is to maximally secure a detection area in preparation for a spatial limit of the light-receiving element 11 and restrict at most reflective waves that may be generated due to the reflection. In an embodiment, an area of the sensing film 140 may range from about 0.5 $mm^2$ to about 1.25 $mm^2$.

The center frequency of the acoustic waves that are output from the light-receiving element 11 may be set to be between about 200 MHz and about 300 MHz because, when the frequency is equal to or greater than 300 MHz, noise increases, and thus a design of the IC chip 300 may become complicated, or a size thereof may increase, and when the frequency is less than or equal to 200 MHz, sizes of input and output electrodes increase.

When the center frequency of the acoustic waves that are output from the light-receiving element 11 is referred to as a first peak, a value of a Q factor (a bandwidth/center frequency of 3 dB) at the first peak may be great. In this way, sweeping of the frequency in the ROIC is reduced by reducing bandwidth of the first peak, and it is easy to identify a change in a first peak value. In some embodiments, the Q-factor at the first peak may be between about 200 and about 600, or preferably between about 240 and about 500.

Also, the acoustic waves output from the light-receiving element 11 may be used to calculate a second peak having a next insertion loss other than the center frequency (the first peak), and thus, a difference between insertion losses of the first and second peaks may be designed to be equal to or greater than 3 dB. As the difference between insertion losses of the first and second peaks is great, the first peak may not be confused with the second peak and the capacity of the IC chip may be reduced.

In the present embodiment, the following design parameters have been secured to ensure that the spatial limit is less than 2.5 mm×2.5 mm, the difference between insertion losses of the first and second peaks is equal to or greater than 3 dB, and the Q-factor at the first peak is between about 200 and about 600.

The number of IDT fingers included in each of the first input electrode 120 and the first output electrode 130 may preferably be between about 35 and about 121.

Also, referring to FIG. 5, a distance between a center of one finger 121a of the first fingers 121 and that of an adjacent finger 121b may be adjusted to be about λ/2, and λ/2 may range from about 6.6 um to about 10 um. A width of one of the fingers 121 and the second fingers 131 may be between about 3.3 um to and about 4.1 um. The first delay gap DG1 may be between about 15 um and about 600 um. An aperture, which is a length obtained as the one finger 121a of the first fingers 121 connected to a first bar electrode 123a of the first input electrode 120 crosses and overlaps the adjacent finger 121b connected to a second bar electrode 123b of the first input electrode 120, may be between about 30 um and about 650 um.

Figure 6:
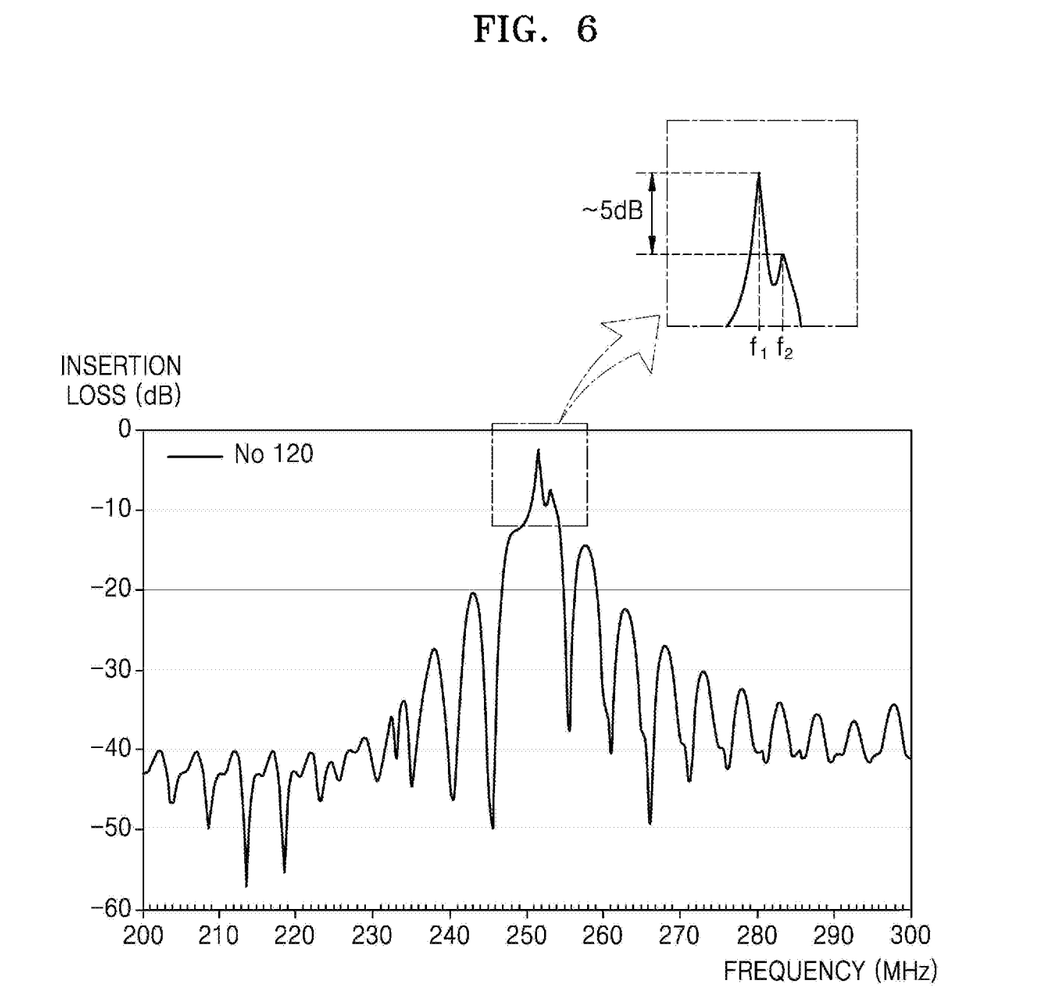
FIG. 6 is a graph showing a simulation of frequency response characteristics of an optical sensor device designed according to an embodiment.
Figure 7:
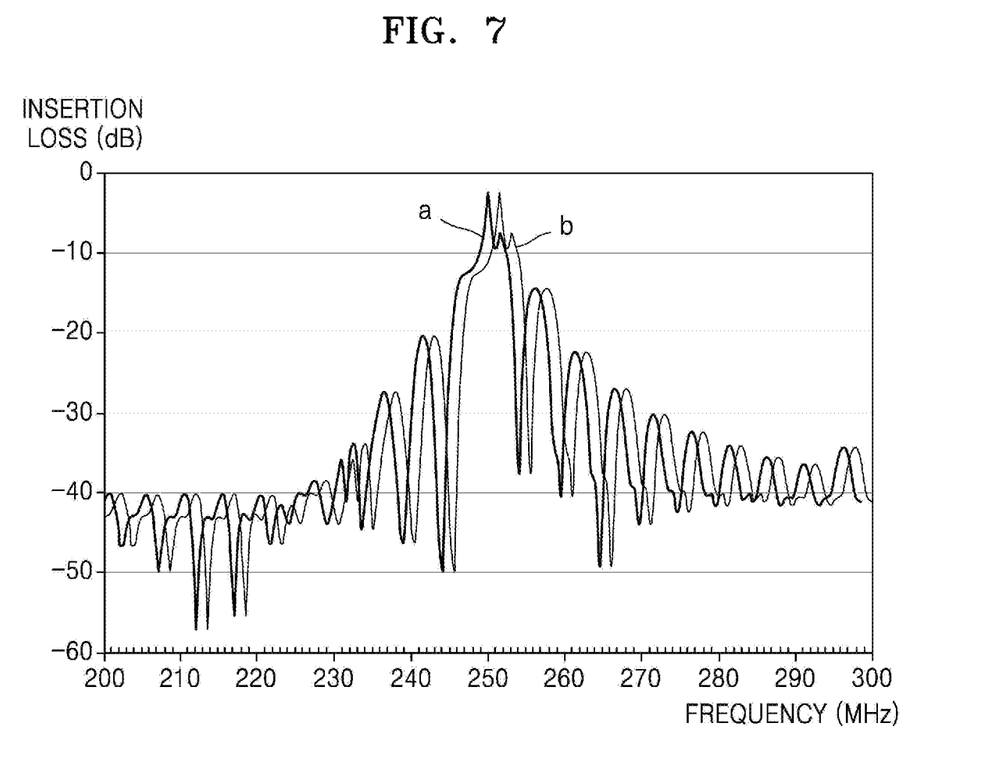
FIG. 7 is a graph showing a simulation of frequency movement characteristics of an optical sensor device designed according to an embodiment.

FIGS. 6 and 7 are graphs showing simulations of frequency response characteristics of a light-receiving element designed by applying the above parameters thereto.

Referring to FIG. 6, the x axis indicates frequency, and the y axis indicates insertion loss. A first peak f1 is at about 255 MHz, and a Q value at the first peak is about 250, which means that characteristics of a center frequency are highly sharp. In addition, a difference between insertion losses of a first peak f1 and a second peak f2 is about 5 dB, and thus, it may be easy to distinguish the first peak f1 and the second peak f2 from each other.

FIG. 7 shows frequency application characteristics of acoustic waves in a case a where light is not transmitted and a case b where light (e.g., ultraviolet rays) is not transmitted. When light is transmitted, the center frequency changes in proportion to the light amount, and thus, it is possible to measure light transmission and an amount of transmitted light.

Figure 8:
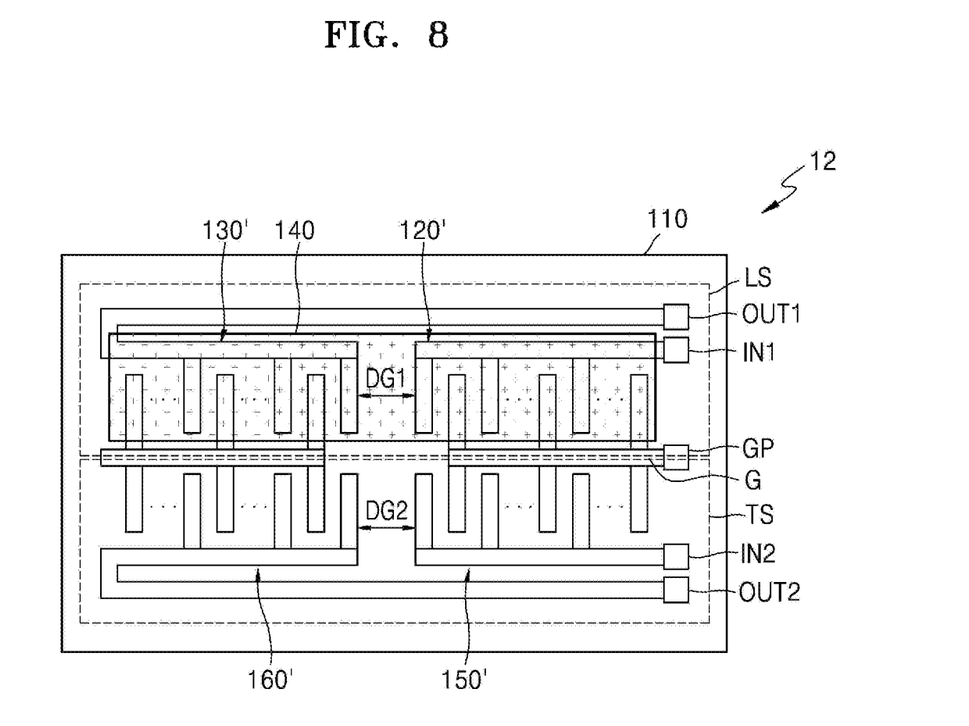
FIG. 8 is a schematic plan view of a light-receiving element according to another embodiment.

FIG. 8 is a schematic plan view of a light-receiving element 12 according to another embodiment. Like reference numerals in FIGS. 3 and 8 denote like elements, and thus their descriptions will be omitted.

Referring to FIG. 8, the light-receiving element 12 has a light sensing area LS and a temperature sensing area TS, and in the light sensing area LS, a first input electrode 120', a first output electrode 130', and the sensing film 140 are disposed, and in the temperature sensing area TS, a second input electrode 150' and a second output electrode 160' are disposed.

The first input electrode 120' and the first output electrode 130' are apart from each other with the first delay gap DG1 therebetween, and the sensing film 140 is disposed by covering at least some portions of the first input electrode 120' and the first output electrode 130'. The second input electrode 150' and the second output electrode 160' are apart from each other with the second delay gap DG2 therebetween, and the second display gap DG2 is exposed to air.

In the present embodiment, a ground electrode G is disposed on a boundary of the light sensing area LS and the temperature sensing area TS. The ground electrode G may be connected to a ground pad GP.

The ground electrode G may function as a common ground with respect to first and second input acoustic waves. Accordingly, with respect to the ground electrode G, a first input electrode 120' and a second input electrode 150' may be symmetrically disposed. That is, the first input acoustic waves may be transmitted to the substrate 110 and the sensing film 140 through the first input electrode 120' and the ground electrode G, and the second input acoustic waves may be transmitted to the substrate 110 through the second input electrode 150' and the ground electrode G.

The first input electrode 120' may be connected to a first input pad IN1, and the second input electrode 150' may be connected to a second input pad IN2. The first output electrode 130' may be connected to a first output pad OUT1, and the second output electrode 160' may be connected to a second output pad OUT2. The ground electrode G may be connected to the ground pad GP.

Since the ground electrode G functions as a common ground with respect to the first and second input acoustic waves, the number of electrodes and electrode pads may decrease, and thus, the total size of the light-receiving element 12 may be reduced.

Figure 9:
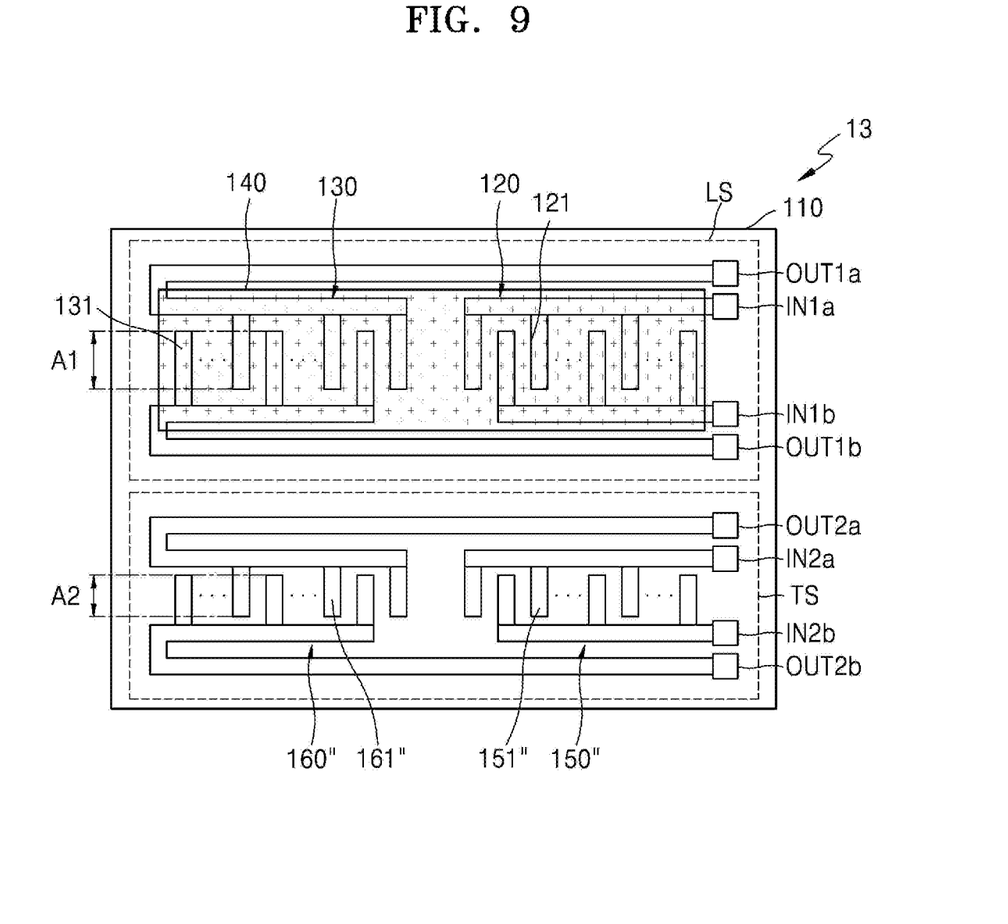
FIG. 9 is a schematic plan view of a light-receiving element according to another embodiment.

FIG. 9 is a schematic plan view of a light-receiving element 13 according to another embodiment. Like reference numerals in FIGS. 3 and 9 denote like elements, and thus there descriptions will be omitted.

Referring to FIG. 9, the light-receiving element 13 has a light sensing area LS and a temperature sensing area TS. In the light sensing area LS, the first input electrode 120, the first output electrode 130, and the sensing film 140 are disposed, and in the temperature sensing area TS, a second input electrode 150" and a second output electrode 160" are disposed.

The first input electrode 120 and the first output electrode 130 are apart from each other with the first delay gap DG1 therebetween, and the sensing film 140 is disposed to cover at least some portions of the first input electrode 120 and the first output electrode 130. The second input electrode 150" and the second output electrode 160" are apart from each other with the second delay gap DG2 therebetween, and the second delay gap DG2 is exposed to air.

In the present embodiment, an area occupied by the temperature sensing area TS may be narrower than an area occupied by the light sensing area LS. A sensing film is not disposed in the temperature sensing area TS, and due to characteristics of a physical property change of the substrate 110 according to the temperature, the temperature sensing area TS may be narrower than the light sensing area LS.

In particular, a length of a first aperture A1, in which the IDT fingers 121 cross and overlap each other, may be greater than a length of a second aperture A2 in which an IDT fingers 151" cross and overlap each other. That is, the length of the second aperture A2 may be less than that of the first aperture A1, and thus, the total size of the light-receiving element 13 may be reduced.

Alternatively, the length of the IDT fingers 151" of the second input electrode 150" may be less than that of the IDT fingers 121 of the first input electrode 120. Accordingly, the total size of the light-receiving element 131 may be reduced.

Figure 10:
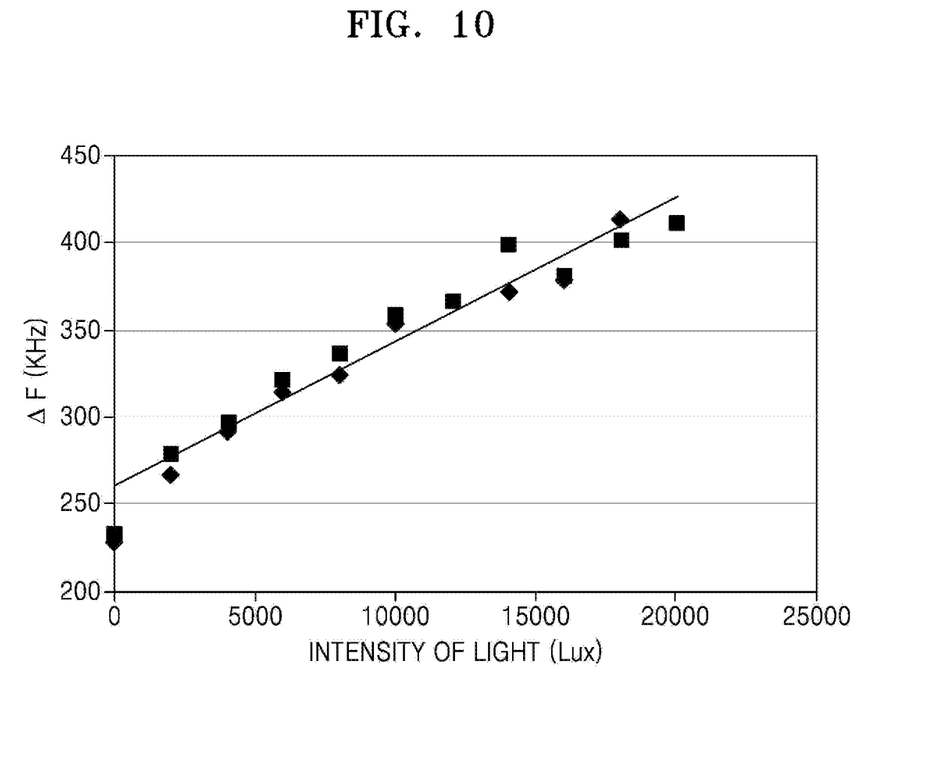
FIG. 10 is a graph showing a variation in a center frequency of output acoustic waves according to a light amount, according to an embodiment.
Figure 11:
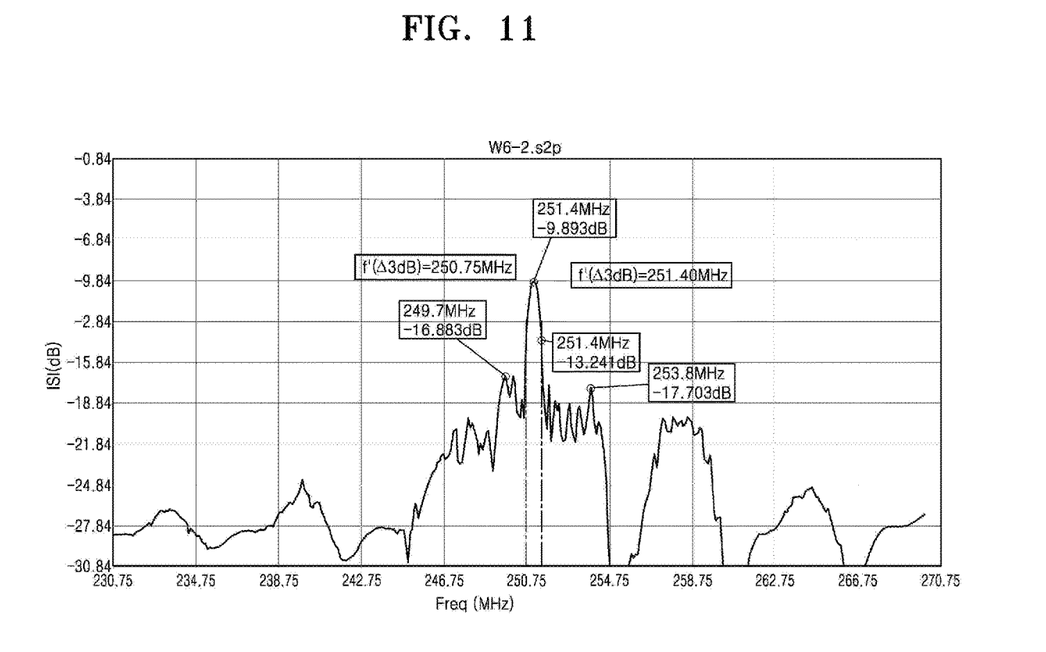
FIG. 11 is a graph showing a waveform of an output acoustic wave, according to an embodiment.

FIGS. 10 and 11 are graphs showing measurements of performance of an optical sensor device, according to an embodiment. FIG. 10 shows data obtained by measuring a change ΔF in a center frequency of acoustic waves, which are output from a light sensing area for detecting visible light, according a light amount. A value of the change ΔF may be a value from which an influence on the temperature is removed based on a value of a center frequency of acoustic waves output from a temperature sensing area. Referring to FIG. 10, a change in the center frequency of the acoustic waves output from a visible light area linearly increases according to an increase in intensity of light, and the change amounts to several hundreds of KHz.

FIG. 11 is a graph showing a waveform of an output acoustic wave, according to an embodiment. Referring to FIG. 11, a center frequency fc of the acoustic wave according to the present embodiment is 251.1 MHz, and a 3 dB bandwidth measures f"(Δ3 dB)−f'(Δ3 dB)=251.4−250.75 MHz=0.65 MHz. Accordingly, it is found that a Q factor of the acoustic wave equals to 251.1/0.65=386.3.

Also, the first peak (i.e., the center frequency) at which the insertion loss is the smallest among the acoustic waves is 251.1 MHz, and in this case, the insertion loss is −9.9 dB. A second peak at which a next insertion loss is 249.7 MHz, and in this case, the insertion loss is −16.9 dB. Accordingly, a difference between the insertion losses at the first and second peaks is 7.0 dB.

A proximity sensor according to the one or more embodiments may simultaneously measure the proximity and temperature of an object. Also, the proximity sensor includes a light-receiving element using surface acoustic waves and thus may be less affected by noise. Output acoustic waves of the light-receiving element have high Q values, and thus, the proximity sensor may have high measurement reliability despite a small size thereof.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. A proximity sensor comprising:
    a circuit board having a first bonding pad area and a second bonding pad area;
    a light-emitting element and a light-receiving element which are apart from each other and mounted on the circuit board and connected to the first and second bonding pad areas, respectively;
    a light barrier disposed between the light-emitting element and the light-receiving element;
    molding portions surrounding the light-emitting element and the light-receiving element; and
    a transparent board disposed on the molding portions and configured to form an air gap with the light-receiving element,
    wherein the light-receiving element comprises:
        a substrate having a light sensing area and a temperature sensing area and comprising a piezo electric material;
        a first input electrode and a first output electrode which are aligned in the light sensing area and apart from each other with a first delay gap between the first input electrode and the first output electrode;
        a sensing film overlapping the first delay gap and covering at least some portions of the first input electrode and the first output electrode; and
        a second input electrode and a second output electrode which are aligned in the temperature sensing area and apart from each other with a second delay gap between the second input electrode and the second output electrode,
    wherein the second delay gap is exposed to air.

2. The proximity sensor of claim 1, wherein the first input electrode is configured to receive a first electrical signal and provide a first input acoustic wave to the light sensing area,
    the first output electrode is configured to output a first output acoustic wave modulated by the sensing film,
    the second input electrode is configured to receive a second electrical signal and provide a second input acoustic wave to the temperature sensing area, and
    the second output electrode is configured to output a second output acoustic wave modulated by the substrate.

3. The proximity sensor of claim 1, wherein, on the circuit board, an integrated circuit (IC) chip connected to the light-receiving element is further mounted, and
    the IC chip is molded by the molding portions.

4. The proximity sensor of claim 1, wherein the light-emitting element comprises a light emitting diode (LED) with wavelengths ranging from about 650 nm to about 780 nm, and
    the sensing film comprises CdS or CdSe.

5. The proximity sensor of claim 1, wherein the first input electrode and the second output electrode comprise Inter Digital Transducer (IDT) electrodes comprising a plurality of fingers having comb shapes, and
    the sensing film covers the plurality of fingers.

6. The proximity sensor of claim 1, further comprising a ground electrode disposed between the light sensing area and the temperature sensing area,
    wherein the first input electrode and the second input electrode are symmetrically aligned with respect to the ground electrode.

7. The proximity sensor of claim 1, wherein, on the transparent board, patterns through which light having a certain frequency band penetrates are formed.

* * * * *